United States Patent
Nagatomo et al.

(10) Patent No.: US 12,034,427 B2
(45) Date of Patent: Jul. 9, 2024

(54) ACOUSTIC WAVE DEVICE

(71) Applicant: Murata Manufacturing Co., Ltd., Nagaokakyo (JP)

(72) Inventors: Shou Nagatomo, Nagaokakyo (JP); Hideki Iwamoto, Nagaokakyo (JP); Takeshi Nakao, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 349 days.

(21) Appl. No.: 17/471,221

(22) Filed: Sep. 10, 2021

(65) Prior Publication Data

US 2021/0408994 A1 Dec. 30, 2021

Related U.S. Application Data

(63) Continuation of application No. PCT/JP2021/010276, filed on Mar. 15, 2021.

(30) Foreign Application Priority Data

Mar. 16, 2020 (JP) ................................ 2020-045395

(51) Int. Cl.
*H03H 9/02* (2006.01)
*H03H 9/13* (2006.01)

(52) U.S. Cl.
CPC .... *H03H 9/02015* (2013.01); *H03H 9/02157* (2013.01); *H03H 9/02228* (2013.01); *H03H 9/131* (2013.01)

(58) Field of Classification Search
CPC ........... H03H 9/02015; H03H 9/02157; H03H 9/02228; H03H 9/131
See application file for complete search history.

(56) References Cited

U.S. PATENT DOCUMENTS

2009/0127978 A1 5/2009 Asai et al.
2012/0223789 A1* 9/2012 Inoue ................. H03H 9/02102
310/313 C (Continued)

FOREIGN PATENT DOCUMENTS

CN 107078713 A 8/2017
JP 2009-124640 A 6/2009

(Continued)

OTHER PUBLICATIONS

Official Communication issued in corresponding Chinese Patent Application No. 202180002548.8 dated Mar. 23, 2022.

(Continued)

*Primary Examiner* — Samuel S Outten
(74) *Attorney, Agent, or Firm* — Keating & Bennett, LLP

(57) ABSTRACT

An acoustic wave device includes a support substrate, a piezoelectric film, a functional electrode, and a support. The support substrate includes a cavity. The piezoelectric film is provided on the support substrate to cover the cavity. The functional electrode is provided on the piezoelectric film to overlap the cavity when viewed in a plan view. The support is in the cavity of the support substrate to support the piezoelectric film. The functional electrode includes electrodes arranged in a direction crossing the thickness direction of the piezoelectric film. The electrodes include a first electrode and a second electrode. The first electrode and the second electrode oppose each other in a direction crossing the thickness direction of the piezoelectric film and are connected to different potentials. Adjacent ones of the electrodes overlap each other in a direction orthogonal to a longitudinal direction of the first electrode.

17 Claims, 12 Drawing Sheets

(56) References Cited

U.S. PATENT DOCUMENTS

| | | | |
|---|---|---|---|
| 2013/0057360 A1* | 3/2013 | Meltaus | ............... H03H 9/564 29/25.35 |
| 2014/0152145 A1* | 6/2014 | Kando | ............... H03H 9/02574 29/25.35 |
| 2017/0187352 A1 | 6/2017 | Omura | |
| 2017/0264266 A1 | 9/2017 | Kishimoto | |
| 2021/0028762 A1* | 1/2021 | Kay | ............... H03H 9/171 |

FOREIGN PATENT DOCUMENTS

| | | |
|---|---|---|
| JP | 2012-034027 A | 2/2012 |
| JP | 2012-257019 A | 12/2012 |
| JP | 2013-066042 A | 4/2013 |
| WO | 2016/052129 A1 | 4/2016 |
| WO | 2016/103925 A1 | 6/2016 |

OTHER PUBLICATIONS

Official Communication issued in International Patent Application No. PCT/JP2021/010276, dated Jun. 1, 2021.

\* cited by examiner

ACOUSTIC WAVE DEVICE

CROSS REFERENCE TO RELATED APPLICATIONS

This application claims the benefit of priority to Japanese Patent Application No. 2020-045395, filed on Mar. 16, 2020, and is a Continuation Application of PCT Application No. PCT/JP2021/010276, filed on Mar. 15, 2021. The entire contents of each application are hereby incorporated herein by reference.

JOINT RESEARCH AGREEMENT

The presently claimed invention was made by or on behalf of the below listed parties to a joint research agreement. The joint research agreement was in effect on or before the effective filing date of the claimed invention, and the claimed invention was made as a result of activities undertaken within the scope of the joint research agreement. The parties to the joint research agreement are (1) Murata Manufacturing Co., Ltd., and (2) Resonant Inc.

BACKGROUND OF THE INVENTION

1. Field of the Invention

The present invention relates to an acoustic wave device.

2. Description of the Related Art

A known acoustic wave device uses plate waves propagating through a piezoelectric film made of $LiNbO_3$ or $LiTaO_3$. For example, Japanese Unexamined Patent Application Publication No. 2012-257019 discloses an acoustic wave device that uses Lamb waves, which are plate waves. The acoustic wave device includes a supporter and a piezoelectric substrate provided on the supporter. The supporter, namely, a support substrate has a cavity. The piezoelectric substrate covers the cavity. The piezoelectric substrate is made of $LiNbO_3$ or $LiTaO_3$. An interdigital transducer (IDT) electrode is provided on an upper surface of the piezoelectric substrate. With two arrays of electrode fingers being included in the IDT electrode and connected to different potentials, a voltage is applied between one of the arrays of electrode fingers and the other array of electrode fingers. Consequently, Lamb waves are excited. Two reflectors are disposed with the IDT electrode therebetween. These components constitute an acoustic wave resonator that uses plate waves.

Increasing the size of the acoustic wave device disclosed in Japanese Unexamined Patent Application Publication No. 2012-257019 entails an increase in the size of the cavity of the support substrate. Such an increase in the size of the cavity can lead to structural weakness of the acoustic wave device.

SUMMARY OF THE INVENTION

Preferred embodiments of the present invention provide acoustic wave devices that each reduce or prevent possible structural weakness associated with a cavity of a support substrate.

An acoustic wave device according to a preferred embodiment of the present invention includes a support substrate, a piezoelectric film, a functional electrode, and at least one support. The support substrate includes a cavity. The piezoelectric film is provided on the support substrate to cover the cavity. The functional electrode is provided on the piezoelectric film to overlap the cavity when viewed in a plan view. The at least one support is in the cavity of the support substrate to support the piezoelectric film. The functional electrode includes electrodes arranged in a direction crossing a thickness direction of the piezoelectric film. The electrodes include a first electrode and a second electrode that oppose each other in the direction crossing the thickness direction of the piezoelectric film and that are connected to different potentials. When viewed in the plan view, the at least one support overlaps an intersection region in which adjacent ones of the electrodes overlap each other in a direction orthogonal to a longitudinal direction of the first electrode.

The acoustic wave devices according to preferred embodiments of the present invention each reduce or prevent possible structural weakness associated with the cavity of the support substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is to be clarified by way of preferred embodiments, which will be described below with reference to the accompanying drawings.

The preferred embodiments described herein are illustrative examples, and partial replacements or combinations of configurations illustrated in different preferred embodiments are possible.

Figure 1:
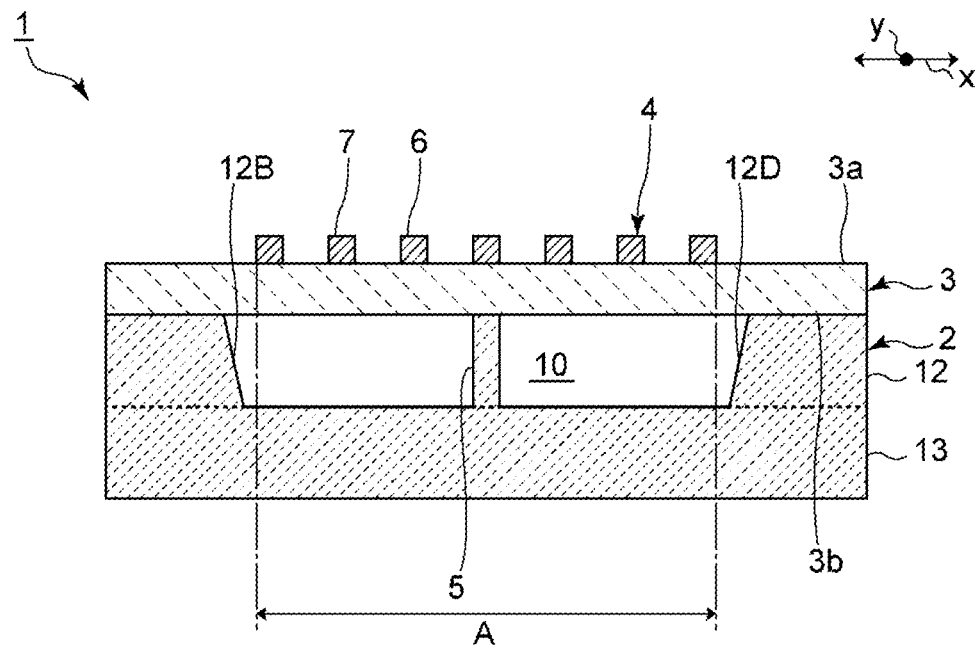
FIG. 1 is an elevational cross-sectional view of an acoustic wave device according to a first preferred embodiment of the present invention.
Figure 2:
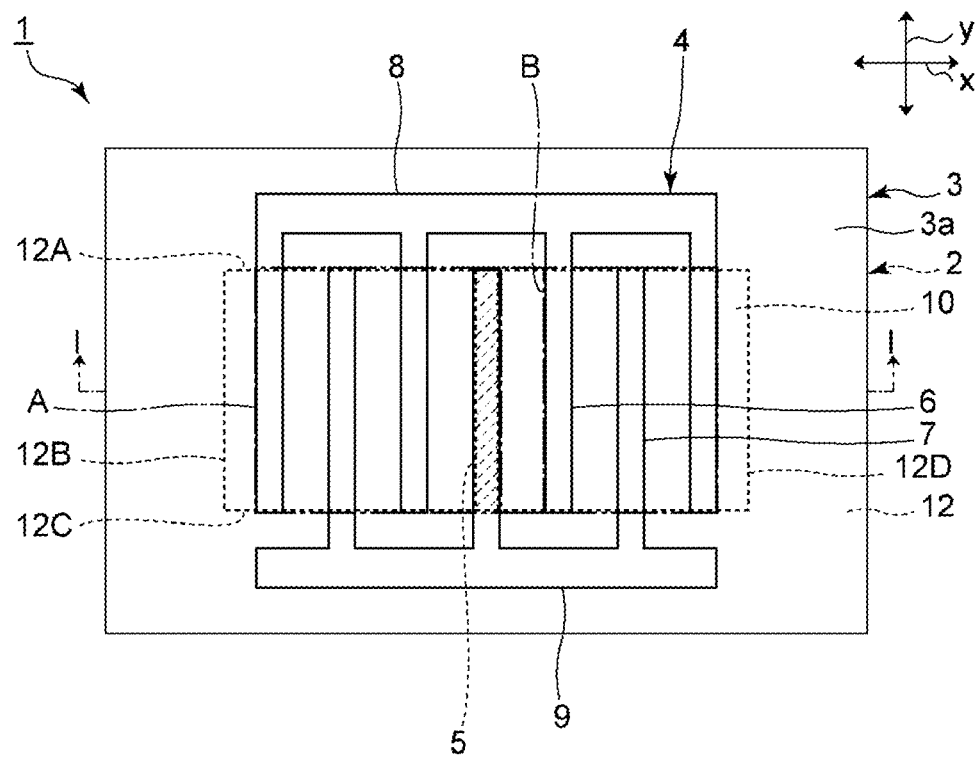
FIG. 2 is a plan view of the acoustic wave device according to the first preferred embodiment of the present invention.

FIG. 1 is an elevational cross-sectional view of an acoustic wave device according to a first preferred embodiment of the present invention. FIG. 2 is a plan view of the acoustic wave device according to the first preferred embodiment. FIG. 1 is a cross-sectional view of the acoustic wave device taken along line I-I in FIG. 2. A support, which will be described later, is hatched in FIG. 2 and in the other plan views.

Referring to FIG. 1, an acoustic wave device 1 preferably includes a support substrate 2, a piezoelectric film 3, a functional electrode 4, and a support 5. The piezoelectric film 3 is provided on the support substrate 2. The functional electrode 4 is provided on the piezoelectric film 3. The support 5 supports the piezoelectric film 3.

The support substrate 2 includes a cavity 10, a support portion 12, and a bottom portion 13. The support portion 12 is frame shaped. The support portion 12 is located on the bottom portion 13. The cavity 10 is a recess of the support substrate 2. More specifically, the cavity 10 is a recess defined by the support portion 12 and the bottom portion 13. The cavity 10 is open on a side on which the piezoelectric film 3 is located. A broken line in FIG. 1 schematically denotes a boundary between the bottom portion 13 and the support portion 12 of the support substrate 2 and a boundary between the support substrate 2 and the support 5.

Referring to FIG. 2, the support portion 12 includes a first inner side surface 12A, a second inner side surface 12B, a third inner side surface 12C, and a fourth inner side surface 12D. The first inner side surface 12A and the third inner side surface 12C are located on opposite sides of the support portion 12. The second inner side surface 12B and the fourth inner side surface 12D are located on opposite sides of the support portion 12. Two ends of the first inner side surface 12A are connected to the second inner side surface 12B and the fourth inner side surface 12D, respectively. Similarly, two ends of the third inner side surface 12C are connected to the second inner side surface 12B and the fourth inner side surface 12D, respectively.

The support substrate 2 is preferably a silicon substrate, for example. One of the surfaces of the support substrate 2 is on the side on which the piezoelectric film 3 is located. This surface is preferably a (100) plane, a (110) plane, or a (111) plane. The support substrate 2 preferably has a resistivity of 4 kΩ, or more, for example. It is not required that the support substrate 2 is made of silicon. Examples of the material of the support substrate 2 include: piezoelectric materials such as, for example, aluminum oxide, lithium tantalate, lithium niobate, and quarts; various kinds of ceramics such as, for example, alumina, magnesia, sapphire, silicon nitride, aluminum nitride, silicon carbide, zirconia, cordierite, mullite, steatite, and forsterite; dielectric materials such as, for example, diamond and glass; and semiconducting materials such as, for example, silicon and gallium nitride.

The piezoelectric film 3 is provided on the support portion 12 of the support substrate 2 to cover the cavity 10. The piezoelectric film 3 includes a first principal surface 3a and a second principal surface 3b. The first principal surface 3a and the second principal surface 3b are located on opposite sides. The second principal surface 3b is closer than the first principal surface 3a to the support substrate 2. The piezoelectric film 3 in the present preferred embodiment is a lithium niobate film. More specifically, the piezoelectric film 3 in the present preferred embodiment is preferably a $LiNbO_3$ film, for example. Alternatively, the piezoelectric film 3 may be made of lithium tantalate ($LiTaO_3$), for example. The thickness of the piezoelectric film 3 is preferably greater than or equal to about 40 nm and less than or equal to about 1,000 nm, for example.

Referring to FIG. 2, the functional electrode 4 is provided on the first principal surface 3a of the piezoelectric film 3. The functional electrode 4 includes a plurality of electrodes. The electrodes are arranged in a direction crossing the thickness direction of the piezoelectric film 3. The electrodes are each preferably rectangular or substantially rectangular in shape, for example. The electrodes include pairs of electrodes, each pair including a first electrode 6 and a second electrode 7. The first electrodes 6 and the second electrodes 7 in the present preferred embodiment extend in parallel or substantially in parallel. Each of the first electrodes 6 and the second electrode 7 adjacent thereto oppose each other in a direction orthogonal to the longitudinal direction of the first electrodes 6. The longitudinal direction of the first electrode 6 is herein denoted by y, and the direction orthogonal to the y direction is herein denoted by x. The x direction and the y direction cross the thickness direction of the piezoelectric film 3. Each of the first electrodes 6 and the second electrode 7 adjacent thereto oppose each other in the direction crossing the thickness direction of the piezoelectric film 3. The term "orthogonal" herein does not necessarily mean the orthogonality in a strict sense and may also mean the substantial orthogonality. The substantial orthogonality herein refers to an angle of about 90° with a margin of error of plus or minus about 10°, for example.

The functional electrode 4 includes a first busbar 8 and a second busbar 9. The first busbar 8 and the second busbar 9 oppose each other. The first electrodes 6 each include an end connected to the first busbar 8. The second electrodes 7 each include an end connected to the second busbar 9. The first electrodes 6 interdigitate with the second electrodes 7. The array of the first electrodes 6 and the array of the second electrodes 7 are connected to different potentials.

The functional electrode 4 is preferably made of a suitable metal or alloy. For example, the functional electrode 4 may be made of Al or an alloy of Al and Cu. The Cu content in the alloy of Al and Cu is preferably greater than or equal to about 1 wt % or less than or equal to about 10 wt %, for example The functional electrode 4 may be made of a multilayer metal film. The multilayer metal film may include an adhesive layer. The adhesive layer may be made of Ti or Cr, for example.

Referring to FIG. 2, the functional electrode 4 includes an intersection region A. In the intersection region A, adjacent ones of the electrodes overlap each other in the x direction. The intersection region A extends from one of two outermost electrodes of the functional electrode 4 in the x direction to the other outermost electrode. The intersection region A includes an end portion on the outer side in the x direction of each of the outermost electrodes.

Figure 3:
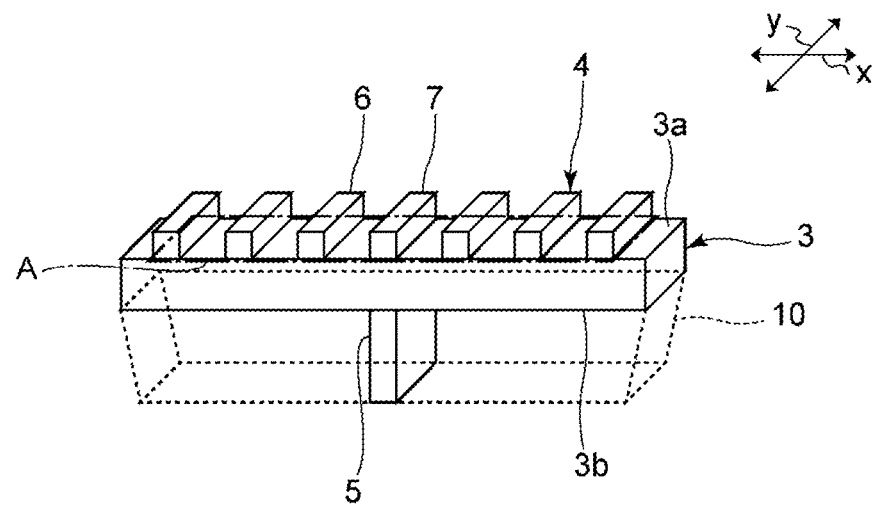
FIG. 3 is a schematic perspective view of a portion of an acoustic wave device, illustrating the inside of a cavity of a support substrate and a layout of constituent elements on a piezoelectric film in the first preferred embodiment of the present invention.

FIG. 3 is a schematic perspective view of a portion of an acoustic wave device, illustrating the inside of a cavity of a support substrate and a layout of constituent elements on a piezoelectric film in the first preferred embodiment. Broken lines in FIG. 3 denote the contour of the cavity 10.

One support 5 is in the cavity 10 of the support substrate 2. When viewed in a plan view, the support 5 overlaps the intersection region A. The expression "viewed in a plan view" herein means being viewed from an upper side in FIG. 1 or 3. When viewed in a plan view, the support 5 overlaps only one of the second electrodes 7. More specifically, the support 5 viewed in a plan view overlaps only a region being a portion of the piezoelectric film 3 and including one of the second electrodes 7 provided thereon.

As illustrated in FIG. 2, the support 5 extends across the cavity 10 to partition the cavity 10. The support 5 is connected to the support portion 12 of the support substrate 2. More specifically, the support 5 is connected to the first inner side surface 12A and the third inner side surface 12C of the support substrate 2. That is, the support 5 is wall-shaped. It is not required that the support 5 is connected to the support portion 12.

The support 5 of the acoustic wave device 1 is preferably made of silicon, for example. As illustrated in FIG. 1, the support 5 and the support substrate 2 are provided as a monolithic one-piece body. More specifically, the support 5 protrudes from the bottom portion 13 of the support substrate 2 toward the piezoelectric film 3. The support 5 is in direct contact with the piezoelectric film 3. The support 5 supports the piezoelectric film 3 accordingly.

In the present preferred embodiment, the support 5 is in the cavity 10 and overlaps the intersection region A when viewed in a plan view. In the presence of the cavity 10 in the support substrate 2, the support 5 can support the piezoelectric film 3 accordingly. The acoustic wave device 1 thereby provides against its possible structural weakness.

In the present preferred embodiment, there is no reflector on the piezoelectric film 3. That is, the acoustic wave device 1 includes no reflector. In a case that the acoustic wave device 1 includes a reflector, electrodes fingers included in the reflector may be few in number. The reason for this is that the acoustic wave device 1 uses bulk waves in the thickness-shear mode. The thickness-shear mode employed in the acoustic wave device 1 will be described below in detail.

Referring to FIG. 2, pairs of electrodes are arranged in the x direction, each pair including the first electrode 6 and the second electrode 7 that are adjacent to each other. It is not required that the number of pairs be an integer. For example, the number of pairs may be 1.5 or 2.5. Adjacent ones of the electrodes included in the functional electrode 4 are not in direct contact with each other. These electrodes are arranged with a space therebetween. In a case that the first electrodes 6 are adjacent to the respective second electrodes 7, neither a HOT electrode nor a ground (GND) electrode is between each of the first electrodes 6 and the second electrode 7 adjacent thereto.

The acoustic wave device 1 is driven in such a manner that an alternating voltage is applied between the array of the first electrodes 6 and the array of the second electrodes 7. More specifically, an alternating voltage is applied between the first busbar 8 and the second busbar 9. Consequently, bulk waves in the thickness-shear mode are excited when propagating through the piezoelectric film 3, and resonance characteristics are exhibited accordingly. The region between each of the first electrodes 6 and the corresponding one of the second electrodes 7 is herein referred to as an excitation region B. Although only one region is denoted by B in FIG. 2, all of the regions between the array of the first electrodes 6 and the array of the second electrodes 7 are included in the excitation region B. The excitation region B is a portion of the intersection region A.

The acoustic wave device 1 is structured to ensure that d/p is less than or equal to about 0.5, for example, where d denotes the thickness of the piezoelectric film 3, and p denotes the center-to-center distance of any one of the pairs of electrodes, each pair including the first electrode 6 and the second electrode 7 that are adjacent to each other. The bulk waves in the thickness-shear mode are thus excited effectively, and favorable resonance characteristics are exhibited accordingly. The center-to-center distance between the first electrode 6 and the second electrode 7 is the distance between the center in the x direction of one of the first electrode 6 in the x direction and the center in the x direction of the second electrode 7 adjacent thereto.

The acoustic wave device 1 is configured as described above and uses the thickness-shear mode. The number of electrode pairs each including the first electrode 6 and the second electrode 7 may be reduced in such a way as to minimize the possibility that the Q value will decrease.

In the present preferred embodiment, a metallization ratio MR may satisfy MR≤1.75 (d/p)+0.075. MR is a ratio of B) to A), where A) means an excitation region where the first electrode finger and the second electrode finger are overlapped when viewed in the direction that the first electrode finger and the second electrode finger are opposed to each other, and B) means a total area of the first electrode finger and the second electrode finger within the excitation region.

In the present preferred embodiment, Euler angles (φ, θ, ψ) of the lithium niobate or the lithium tantalite may fall within the range of any of the following formula 1), 2) and 3);

$$(0°±10°, 0°~20°, \psi) \quad \text{formula 1);}$$

$$(0°±10°, 20°~80°, 0°~60°(1-(\theta-50)2/900)1/2)) \text{ or}$$
$$(0°±10°, 20°~80°, [180°-60°(1-(\theta-50)2/900)1/2)]~180° \quad \text{formula 2); and}$$

$$(0°±10°, [180°-30°(1-(\psi-90)2/8100)1/2)]~180°, \psi) \quad \text{formula 3).}$$

In the present preferred embodiment, Euler angles (φ, θ, ψ) of the lithium niobate or the lithium may be positioned within the region A shown in FIG. 2.

The piezoelectric film 3 in the present preferred embodiment is preferably made of a Z-cut piezoelectric material, for example. Thus, the x direction is orthogonal or substantially orthogonal to the polarization direction of the piezoelectric film 3, except where the piezoelectric film 3 is made of a piezoelectric material having a cut-angle different from the specified angle.

Some conventional acoustic wave devices use Lamb waves. The following describes points of difference between a bulk wave in the thickness-shear mode and a Lamb wave with reference to FIGS. 4A and 4B.

Figure 4A:
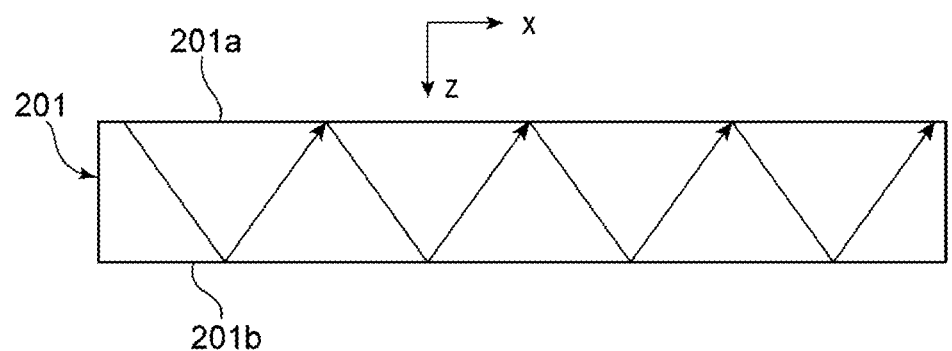
FIG. 4A is a schematic elevational cross-sectional view explaining Lamb waves, illustrating a state in which a Lam wave propagates through a piezoelectric film of a conventional acoustic wave device.

FIG. 4A is a schematic elevational cross-sectional view for explanation of Lamb waves, illustrating a state in which a Lamb wave propagates through a piezoelectric film of an acoustic wave device, such as the one disclosed in Japanese Unexamined Patent Application Publication No. 2012-257019. Arrows in FIG. 4A denote propagation of a wave in a piezoelectric film 201. The piezoelectric film 201 has a first principal surface 201a and a second principal surface 201b, which are located on opposite sides. The thickness direction or, more specifically, the direction of an imaginary line forming a connection between the first principal surface 201a and the second principal surface 201b is denoted by z. The direction in which electrode fingers of an IDT electrode are arranged in an array is denoted by x. As illustrated in FIG. 4A, a Lamb wave propagates in the x direction. Lamb waves are plate waves. Thus, the wave propagates in the x direction while the piezoelectric film 201 vibrates as a whole. The IDT electrode is disposed between reflectors on the respective sides in the x direction such that resonance characteristics are exhibited.

Figure 4B:
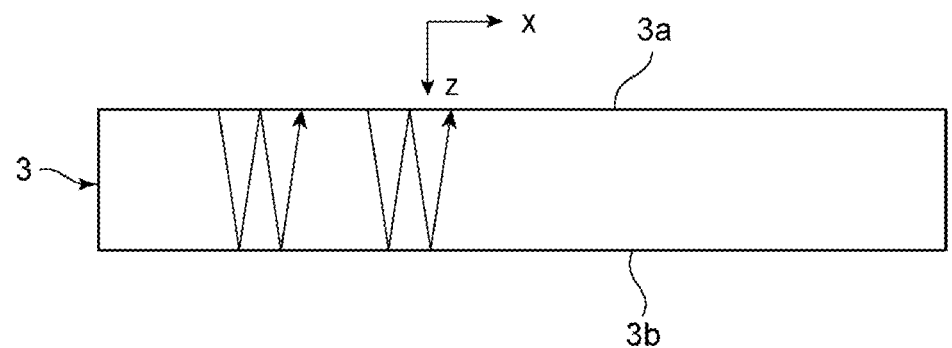
FIG. 4B is a schematic elevational cross-sectional view explaining bulk waves in the thickness-shear mode, illustrating a state in which a bulk wave in the thickness-shear mode propagates through a piezoelectric film of an acoustic wave device according to a preferred embodiment of the present invention.

Referring to FIG. 4B, the acoustic wave device according to the present preferred embodiment involves vibrational displacement in the thickness sheer direction. For this reason, a wave propagates mostly in the z direction, and resonance occurs accordingly. The x-direction component of the wave is thus much smaller than the z-direction component of the wave. As the wave propagates in the z direction, resonance characteristics are exhibited. The number of electrode fingers included in a reflector may thus be reduced with minimized propagation loss. For further miniaturization, the number of electrode pairs each including the first electrode 6 and the second electrode 7 may be reduced in such a way as to minimize the possibility that the Q value will decrease.

Figure 5:
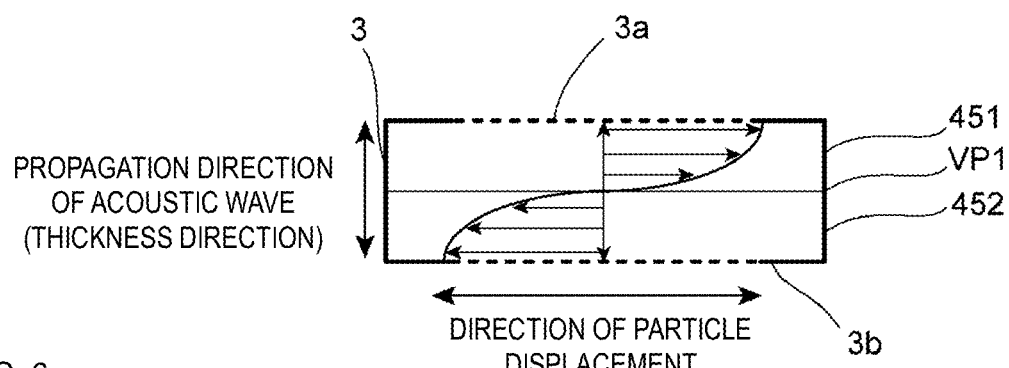
FIG. 5 illustrates the direction of the amplitude of a bulk wave in the thickness-shear mode.

Referring to FIG. 5, the amplitude of a bulk wave in the thickness-shear mode in a first region 451 is opposite in direction to the amplitude of a bulk wave in a second region 452. The first region 451 and the second region 452 are included in the excitation region of the piezoelectric film 3. FIG. 5 schematically illustrates a bulk wave for the case in which a voltage is applied between an array of the first electrodes 6 and an array of the second electrodes 7 in such a manner that the second electrodes 7 are at a higher potential than the first electrode 6. The first region 451 is a portion of the excitation region and extends between the first principal surface 3a and an imaginary plane VP1, which is orthogonal or substantially orthogonal to the thickness direction of the piezoelectric film 3 and divides the piezoelectric film 3 into two pieces. The second region 452 is a portion of the excitation region and extends between the second principal surface 3b and the imaginary plane VP1.

As described above, the acoustic wave device 1 includes pairs of electrodes, each pair including the first electrode 6 and the second electrode 7. The thickness-shear mode does not involve propagation of waves in the x direction. For this reason, it is not required that more than one electrode pair including the first electrode 6 and the second electrode 7 be disposed. In other words, it is required that at least one electrode pair including the first electrode 6 and the second electrode 7 be disposed.

The first electrodes 6 of the acoustic wave device 1 are connected to the HOT potential, and the second electrodes 7 of the acoustic wave device 1 are connected to the GND potential. Alternatively, the first electrodes 6 may be connected to the GND potential, and the second electrodes 7 may be connected to the HOT potential. As mentioned above, at least one pair of electrodes is disposed in such a manner that each electrode of the pair of electrodes is connected to the HOT potential or the GND potential. That is, the acoustic wave device according to the present preferred embodiment includes no floating electrode.

In the present preferred embodiment, d/p is preferably less than or equal to about 0.5, for example. It is preferable that d/p be less than or equal to about 0.24, for example. More favorable resonance characteristics will be exhibited accordingly. The reason for this will be described below with reference to FIG. 6.

Figure 6:
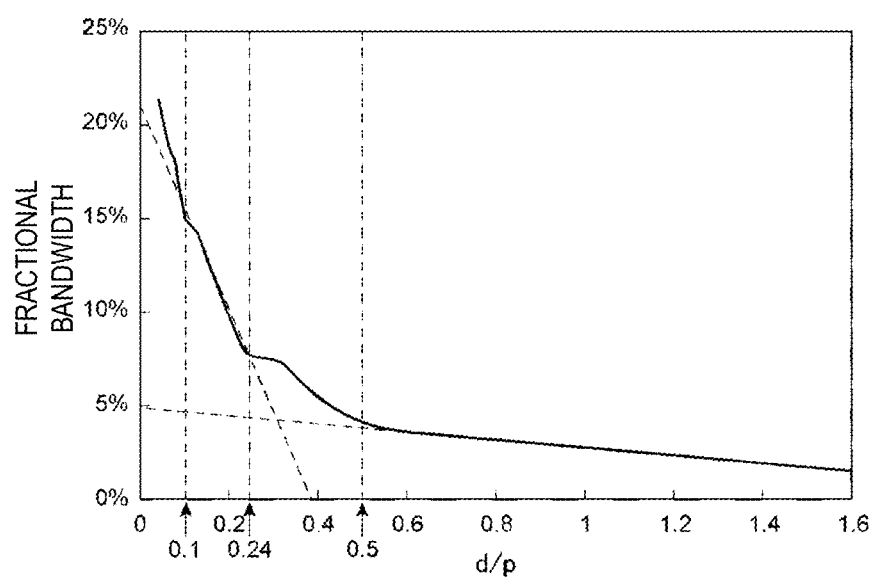
FIG. 6 illustrates the relationship between d/p and the fractional bandwidth of acoustic wave devices functioning as resonators, where p denotes the center-to-center distance of adjacent electrodes (a first electrode and a second electrode) or a mean value of the center-to-center distances of adjacent electrodes, and d denotes the thickness of the piezoelectric film.

The following description concerns different acoustic wave devices with different values of d/p. FIG. 6 illustrates the relationship between d/p and the fractional bandwidth of each of the acoustic wave devices defining and functioning as resonators.

As is clear from FIG. 6, the fractional bandwidth for the case in which d/p>0.5 is less than about 5%, for example, irrespective of variations in d/p. Meanwhile, d/p may be adjusted such that the fractional bandwidth for the case in which d/p≤0.5 is greater than or equal to about 5%, for example. Adjusting d/p in this manner is conductive to providing a resonator with a higher coupling coefficient. The fractional bandwidth for the case in which d/p≤0.24 is greater than or equal to about 7%, for example. Adjusting d/p within the specified range is conductive to providing a resonator with a broader fractional bandwidth and, by extension, a higher coupling coefficient. In a case that the thickness of the piezoelectric film 3 is uneven, the mean value of the thickness may be used.

The center-to-center distance p of an electrode pair including the first electrode 6 and the second electrode 7 that are adjacent to each other is preferably greater than or equal to about 1 μm and less than or equal to about 10 μm, for example. The dimension of each electrode of the functional electrode 4 in the x direction, that is, the width of each of the first electrodes 6 and the width of each of the second electrodes 7 each preferably be greater than or equal to about 50 nm and less than or equal to about 1,000 nm, for example.

When viewed in a plan view, the support 5 in the first preferred embodiment overlaps only the region in which one of the second electrodes 7 is located, as illustrated in FIG. 1. The acoustic wave device 1 thus provides against its possible structural weakness, with almost no degradation of the resonance characteristics. This point will be described below in detail by way of a comparison of the first preferred embodiment and a comparative example embodiment. The comparative example embodiment differs from the first preferred embodiment in that no support is included.

The following description concerns an acoustic wave device according to the first preferred embodiment and an acoustic wave device according to the comparative example embodiment, for comparison of their impedance-frequency characteristics. The design parameters of the acoustic wave device according to the first preferred embodiment are as follows. The width of the support 5 is the dimension of the support 5 in the x direction. Except for the support 5, the design parameters of the acoustic wave device according to the comparative example embodiment are identical to the design parameters of the acoustic wave device according to the first preferred embodiment.

the piezoelectric film 3: made of $LiNbO_3$ and measuring about 400 nm in thickness
    the number of pairs of electrodes (each pair including the first electrode 6 and the second electrode 7): 50
    the support substrate 2: made of Si
    the support 5: made of Si and measuring about 1.012 μm in width
    the center-to-center distance p of an electrode pair including the first electrode 6 and the second electrode 7: about 3.75 μm
    the first electrodes 6 and the second electrodes 7: each measuring about 1.012 μm in width
    d/p: about 0.107

Figure 7:
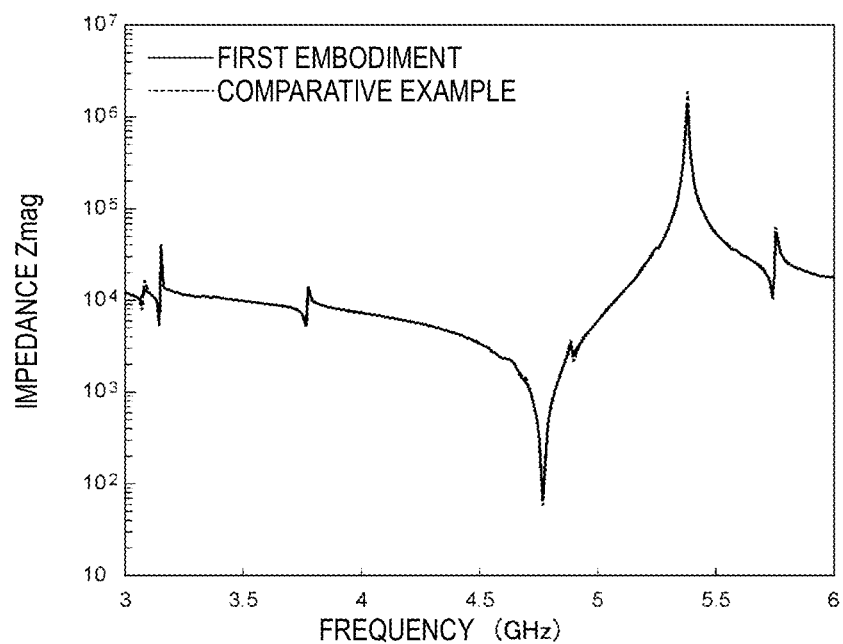
FIG. 7 illustrates impedance-frequency characteristics of an acoustic wave device according to the first preferred embodiment of the present invention and impedance-frequency characteristics of an acoustic wave device according to a comparative example embodiment.

FIG. 7 illustrates impedance-frequency characteristics of the acoustic wave device according to the first preferred embodiment and impedance-frequency characteristics of the acoustic wave device according to the comparative example embodiment.

As can be seen from FIG. 7, there is not much difference between the first preferred embodiment and the comparative example embodiment in terms of the impedance-frequency characteristics. The first preferred embodiment employs the thickness-shear mode. The excitation region B, which is a portion of the piezoelectric film 3 and is located between the array of the first electrodes 6 and the array of the second electrodes 7, undergoes large displacements. The remaining region of the piezoelectric film 3 or, more specifically, the region in which the first electrodes 6 and the second electrodes 7 are located undergoes small displacements. When viewed in a plan view, the support 5 of the acoustic wave device 1 overlaps only the region in which one of the second electrodes 7 is located. That is, the support 5 is in contact with only the region in which the amount of displacement of the piezoelectric film 3 is small, and the displacement of the piezoelectric film 3 is less inhibited accordingly. The acoustic wave device 1 thereby provides against its possible structural weakness, with almost no degradation of the resonance characteristics. Alternatively, the support 5 viewed in a plan view may overlap only a region in which one of the first electrodes 6 is located. In this case as well, the acoustic wave device 1 provides against its possible structural weakness, with almost no degradation of the resonance characteristics.

The area of the overlap between the support 5 and the piezoelectric film 3 viewed in a plan view is preferably smaller than the area of the overlap between one of the electrodes of the functional electrode 4 and the piezoelectric film 3 viewed in a plan view. This layout more reliably ensures that the displacement of the piezoelectric film 3 is less inhibited. It is only required that the support 5 overlap the intersection region A when viewed in a plan view.

In the first preferred embodiment, a dimension of the cavity 10 in the y direction is equal to a dimension of the intersection region A in the y direction. When viewed in a plan view, the support 5 of the acoustic wave device 1 overlaps only a portion of the region in which one of the second electrodes 7 is located. The portion concerned is located within the intersection region A. It is not required that the cavity 10 be as described above. The intersection region A is entirely located within the cavity 10 when viewed in a plan view. That is, the dimension of the cavity 10 in the y direction is greater than or equal to the dimension of the intersection region A in the y direction. The displacement of the piezoelectric film 3 may be less inhibited during the application of voltage to the functional electrode 4.

The first busbar 8 and the second busbar 9 in the first preferred embodiment extend in the direction in which each of the first electrodes 6 and the corresponding one of the second electrodes 7 oppose each other. The functional electrode 4 is shaped as described above. For example, the first busbar 8 and the second busbar 9 may extend in a direction perpendicular or substantially perpendicular to the direction in which each of the first electrodes 6 and the corresponding one of the second electrodes 7 oppose each other. In this case, the first electrodes 6 and the second electrodes 7 may each be L-shaped.

The following describes modifications of the first preferred embodiment. As with the acoustic wave device according to the first preferred embodiment, the acoustic wave devices according to the following modifications provide against the possible structural weakness.

Figure 8:
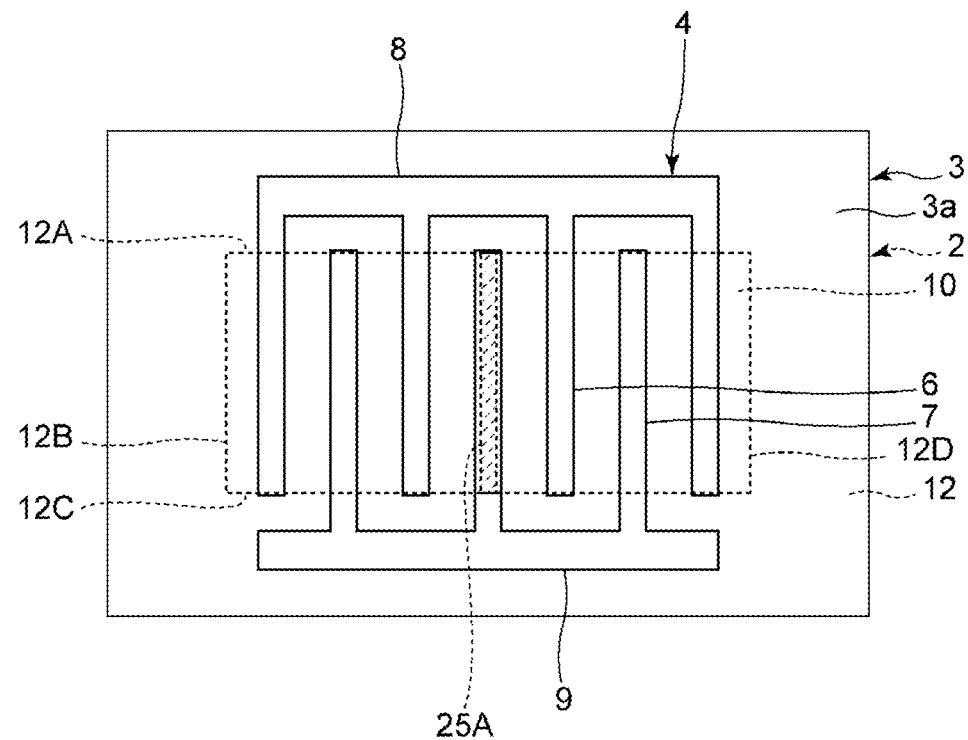
FIG. 8 is a plan view of an acoustic wave device according to a first modification of the first preferred embodiment of the present invention.
Figure 9:
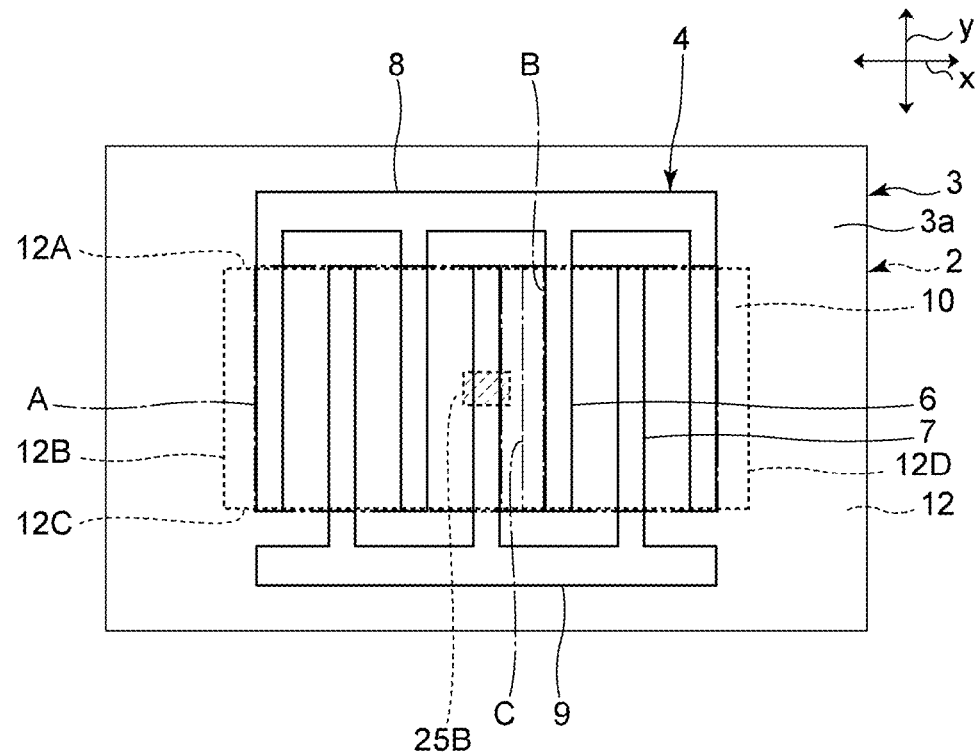
FIG. 9 is a plan view of an acoustic wave device according to a second modification of the first preferred embodiment of the present invention.
Figure 10:
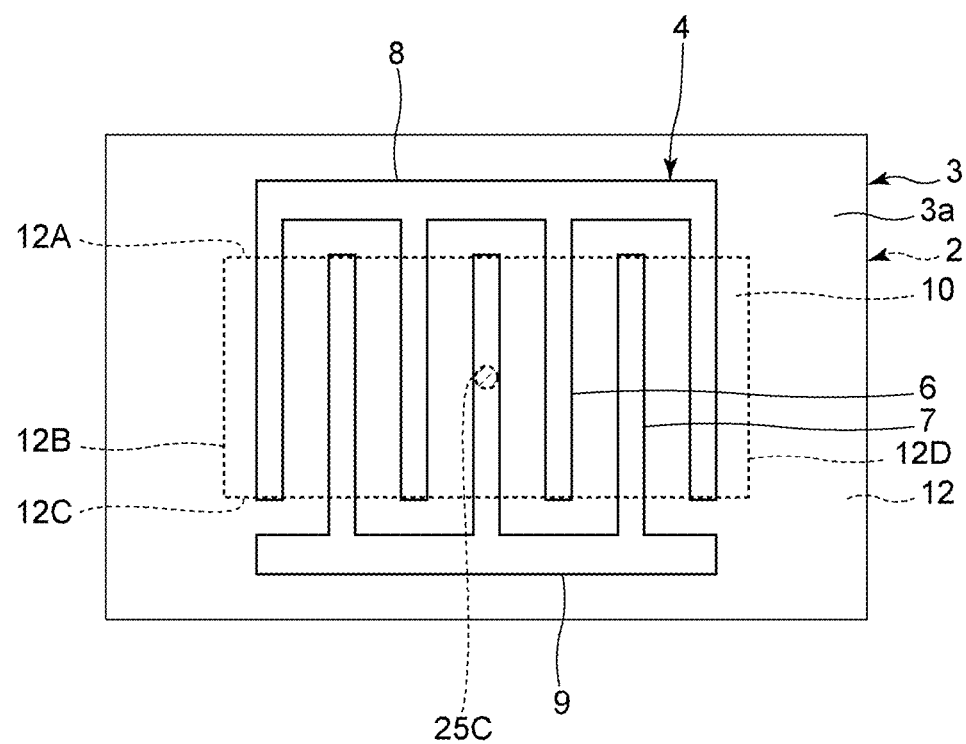
FIG. 10 is a plan view of an acoustic wave device according to a third modification of the first preferred embodiment of the present invention.

FIGS. 8 to 10 illustrate a first modification, a second modification, and a third modification of a preferred embodiment of the present invention, respectively. The difference between the first preferred embodiment and each of the first to third modifications is in only the shape of the support. Referring to FIG. 8, the first modification includes a support 25A, which is narrower than the corresponding second electrode 7.

Referring to FIG. 9, the second modification includes a support 25B, which has a rectangular or substantially rectangular prism shape. The support 25B is not connected to the support portion 12 of the support substrate 2. The support 25B is wider than the corresponding second electrode 7. The area of the overlap between the support 25B and the piezoelectric film 3 viewed in a plan view is smaller than the area of the overlap between one of the electrodes of the functional electrode 4 and the piezoelectric film 3 viewed in a plan view. When viewed in a plan view, the support 25B overlaps the corresponding second electrode 7 and the excitation region B. When viewed in a plan view, the overlap between the support 25B and the excitation region B is closer than C to the corresponding second electrode 7, where C denotes the center in the x direction of one of sub-regions defining the excitation region B.

Referring to FIG. 10, the third modification includes a support 25C, which is cylindrical or substantially cylindrical. The support 25C is not connected to the support portion 12 of the support substrate 2.

The acoustic wave device according to the first preferred embodiment includes one support 5. Alternatively, the acoustic wave device may include more than one support, as in a fourth modification and a fifth modification, which will be described below.

Figure 11:
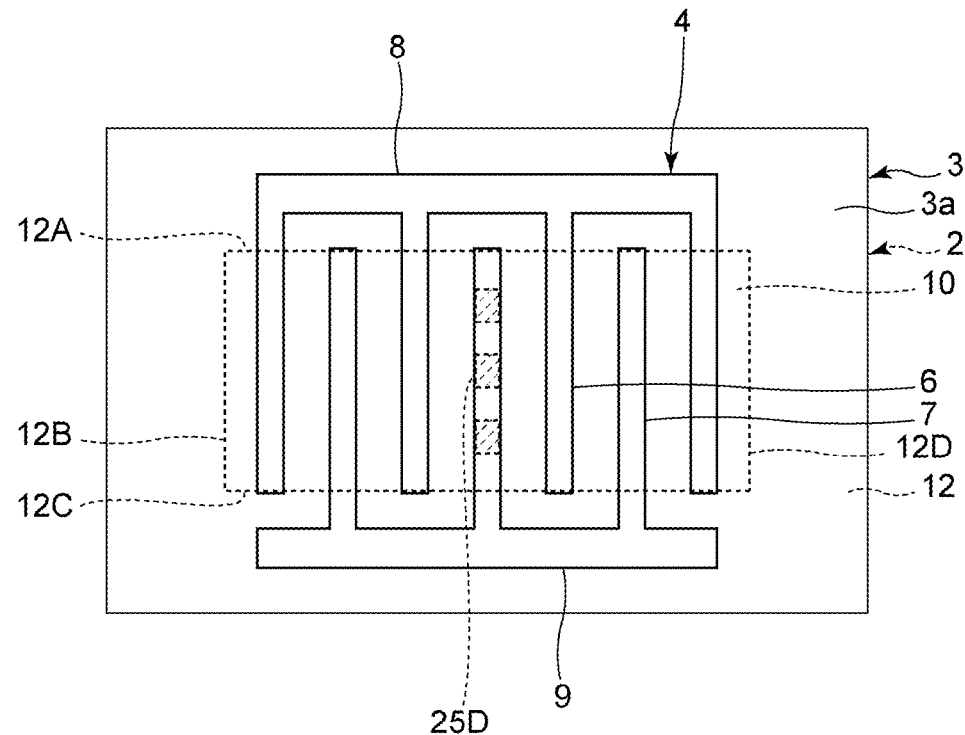
FIG. 11 is a plan view of an acoustic wave device according to a fourth modification of the first preferred embodiment of the present invention.

Referring to FIG. 11, the fourth modification includes supports 25D, which are in the cavity 10 of the support substrate 2. The supports 25D each in the form of a rectangular prism. When viewed in a plan view, all of the supports 25D overlap the same second electrode 7. The supports 25D overlap only a region being a portion of the piezoelectric film 3 and including one of the second electrodes 7 thereon.

Figure 12:
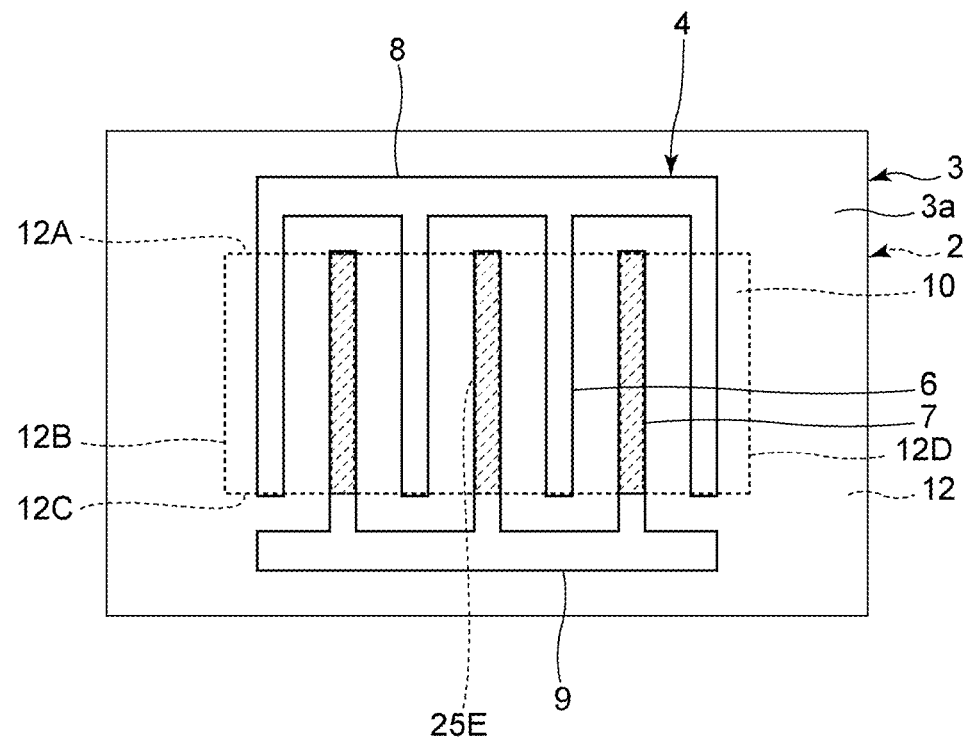
FIG. 12 is a plan view of an acoustic wave device according to a fifth modification of the first preferred embodiment of the present invention.

Referring to FIG. 12, the fifth modification includes supports 25E, which are in the cavity 10 of the support substrate 2. The supports 25E are each in a wall shape. When viewed in a plan view, the supports 25E overlap the respective second electrodes 7. Each of the supports 25E overlaps only a region being a portion of the piezoelectric film 3 and including the corresponding second electrode 7 thereon. In this modification, the supports 25E are each connected to the first inner side surface 12A and the third inner side surface 12C of the support substrate 2. This modification may be altered in such a manner that at least one of the supports 25E is not connected to the first inner side surface 12A or the third inner side surface 12C.

When viewed in a plan view, the supports 25E in this modification overlap the respective second electrodes 7. Alternatively, one support 25E may overlap one of the first electrodes 6 when viewed in a plan view, and another support 25E may overlap one of the second electrodes 7 when viewed in a plan view. It is not required that the layout of the supports 25E be as described above. It is only required that the supports 25E overlap the intersection region A when viewed in a plan view.

Figure 13:
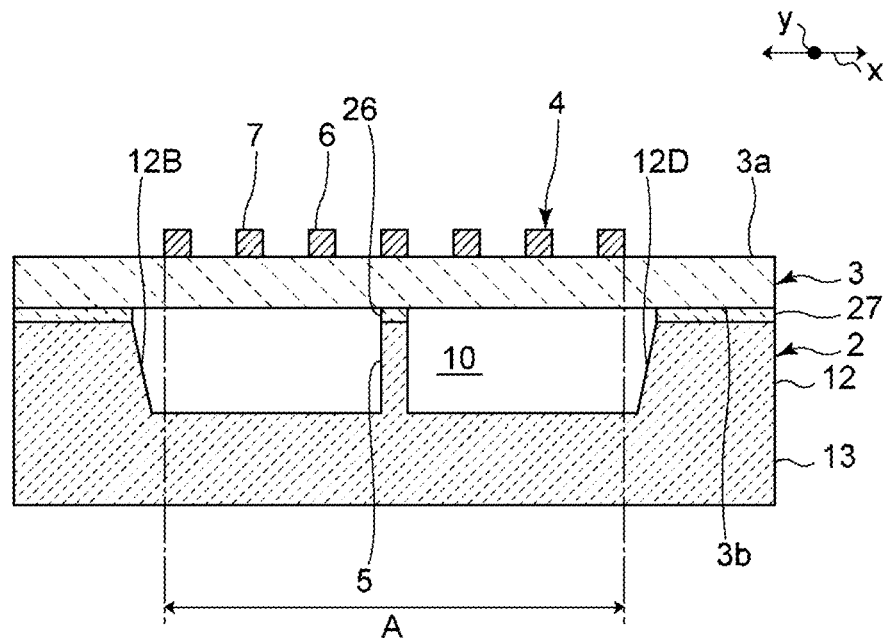
FIG. 13 is an elevational cross-sectional view of an acoustic wave device according to a sixth modification of the first preferred embodiment of the present invention.

FIG. 13 is an elevational cross-sectional view of an acoustic wave device according to a sixth modification of the first preferred embodiment.

The piezoelectric film 3 of the support 5 in this modification is overlaid with an insulating film 26. The support 5 indirectly contacts the piezoelectric film 3, with the insulating film 26 therebetween. It is not required that the support 5 be in direct contact with the piezoelectric film 3. The support portion 12 of the support substrate 2 is overlaid with an insulating film 27. The support substrate 2 indirectly contacts the piezoelectric film 3, with the insulating film 27 therebetween. It is not required that the support substrate 2 be in direct contact with the piezoelectric film 3. The insulating films 26 and 27 are made of silicon oxide, for example. Alternatively, the insulating films 26 and 27 may be made of a suitable insulating material, such as silicon nitride, silicon oxynitride, or alumina, for example.

The support 5 or the support substrate 2 may be in direct contact with the piezoelectric film 3. The insulating films 26 and 27 may be provided as one insulating film.

Figure 14:
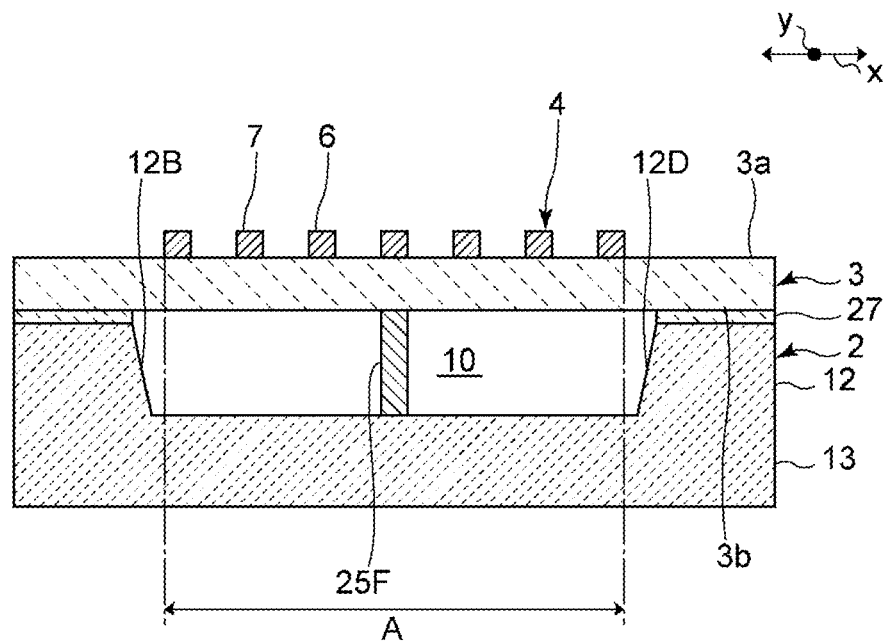
FIG. 14 is an elevational cross-sectional view of an acoustic wave device according to a seventh modification of the first preferred embodiment of the present invention.

FIG. 14 is an elevational cross-sectional view of an acoustic wave device according to a seventh modification of the first preferred embodiment.

In this modification, a support 25F and the support substrate 2 are provided by separate discrete structures. The support 25F is made of a suitable metal. Alternatively, the support 25F may be made of a suitable semiconductor or a suitable insulator. As in the sixth modification, the insulating film 27 is between the support portion 12 of the support substrate 2 and the piezoelectric film 3. Alternatively, the support substrate 2 may be in direct contact with the piezoelectric film 3.

The thermal conductivity of the support 25F is preferably greater than or equal to the thermal conductivity of the piezoelectric film 3. While heat is generated by excitation of acoustic waves, transfer of heat from the piezoelectric film 3 to the support 25F is promoted accordingly. The heat transferred from the piezoelectric film 3 to the support 25F is then transferred toward the support substrate 2. Consequently, thermal dissipation may be improved. As described above, the support 25F in this modification is preferably made of metal. The thermal conductivity of the support 25F made of metal is advantageously high such that improved thermal dissipation is further ensured.

As illustrated in FIG. 14, the support 25F is in direct contact with the piezoelectric film 3. The direct contact between them enables an effective improvement in thermal dissipation. Alternatively, the insulating film 26 may be disposed between the support 25F and the piezoelectric film 3, as in the sixth modification.

Figure 15:
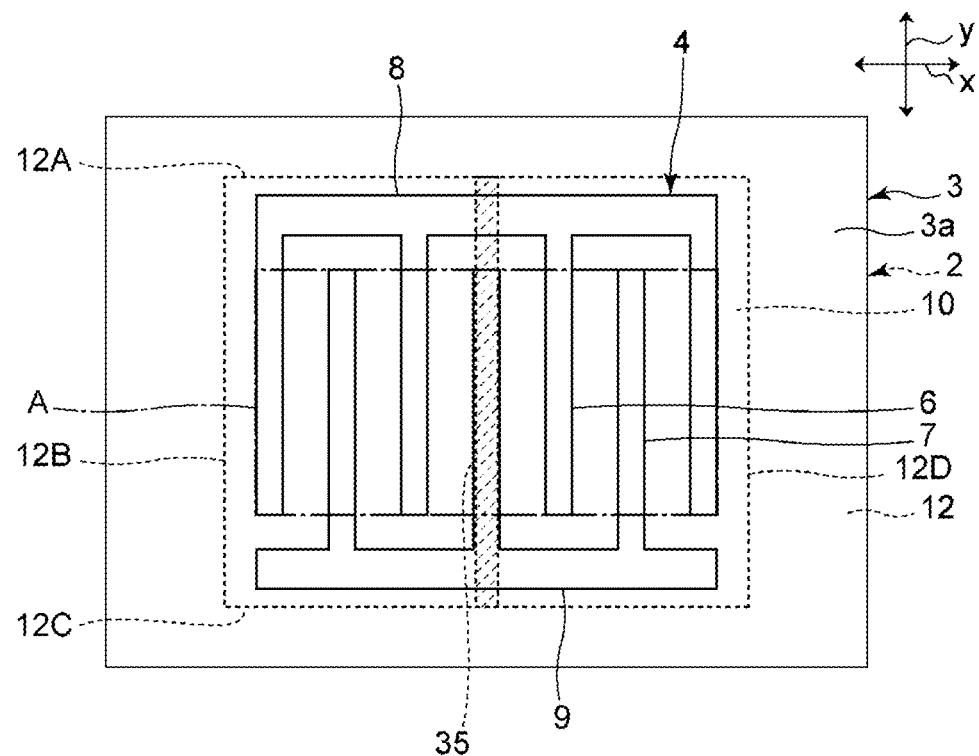
FIG. 15 is a plan view of an acoustic wave device according to a second preferred embodiment of the present invention.

FIG. 15 is a plan view of an acoustic wave device according to a second preferred embodiment of the present invention.

The present preferred embodiment differs from the first preferred embodiment in that the dimension of the cavity 10 in the y direction is greater than the dimension of the intersection region A in the y direction. Another difference between the first preferred embodiment and the second preferred embodiment is in the placement of the support. The support in the second preferred embodiment is denoted by 35. The acoustic wave device in the present preferred embodiment is otherwise structurally identical or substantially identical to the acoustic wave device 1 according to the first preferred embodiment.

The dimension of the cavity 10 in the y direction is greater than the dimension of the functional electrode 4 in the y direction. The support portion 12 of the support substrate 2 surrounds the functional electrode 4 when viewed in a plan view. The functional electrode 4 is entirely located within the cavity 10 when viewed in a plan view.

The support 35 is connected to the first inner side surface 12A and the third inner side surface 12C of the support substrate 2. The support 35 overlaps the first busbar 8 and the second busbar 9 when viewed in a plan view. The support 35 viewed in a plan view also overlaps regions closer than the functional electrode 4 on the piezoelectric film 3 to the respective edges of the piezoelectric film 3 in the y direction.

As with the acoustic wave device according to the first preferred embodiment, the acoustic wave device according to the present preferred embodiment reduces or prevents structural weakness. In the case that the dimension of the cavity 10 in the y direction is greater than the dimension of the intersection region A in the y direction, it is not required that the support 35 be disposed as described above. For example, the support 35 may be disposed as is the case with the first preferred embodiment or any one of the modifications thereof.

Figure 16:
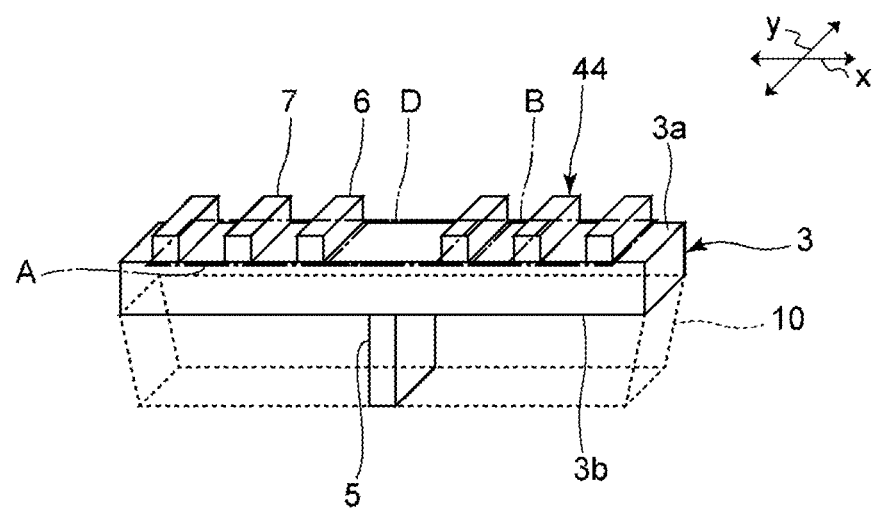
FIG. 16 is a schematic perspective view of part of an acoustic wave device, illustrating the inside of a cavity of a support substrate and a layout of constituent elements on a piezoelectric film in a third preferred embodiment of the present invention.

FIG. 16 is a schematic perspective view of a portion of an acoustic wave device, illustrating the inside of a cavity of a support substrate and a layout of constituent elements on a piezoelectric film in a third preferred embodiment of the present invention.

The differences between the present preferred embodiment and the first preferred embodiment are in the layout of the electrodes of the functional electrode and in the positional relationship between the functional electrode and the support 5. The functional electrode in the present preferred embodiment is denoted by 44. The acoustic wave device in the present preferred embodiment is otherwise structurally identical or substantially identical to the acoustic wave device 1 according to the first preferred embodiment.

In a portion of the functional electrode 44, two of the first electrodes 6 are adjacent to each other. A region between the two adjacent first electrodes 6 on the piezoelectric film 3 is herein referred to as a non-excitation region D. In the present preferred embodiment, the center-to-center distance of the two adjacent first electrodes 6 is about 2p, for example. Bulk waves in the thickness-shear mode are not excited in the non-excitation region D. The non-excitation region D is a portion of the intersection region A.

The center-to-center distance of the two adjacent first electrodes 6 is preferably about 2p with a margin of error of plus or minus about 0.5p, for example. In a case that the center-to-center distance falls within this range, the acoustic wave device operates with almost no degradation of the resonance characteristics.

The support 5 overlaps the non-excitation region D when viewed in a plan view. The non-excitation region D of the piezoelectric film 3 undergoes small displacements. That is, the support 5 in the present preferred embodiment supports the piezoelectric film 3 in such a manner that the displacement of the piezoelectric film 3 is less inhibited. The acoustic wave device thereby provides against its possible structural weakness, with almost no degradation of the resonance characteristics.

The support 5 in the present preferred embodiment is preferably disposed as illustrated in FIG. 16. More specifically, the support 5 preferably overlaps the midsection of the non-excitation region D between two adjacent first electrodes 6 when viewed in a plan view. The midsection in the x direction is farther than the rest of the non-excitation region D from the excitation region B, and the amount of displacement of the piezoelectric film 3 in the midsection is thus much smaller. For this reason, the support 5 supports the piezoelectric film 3 in such a manner that the displacement of the piezoelectric film 3 is much less inhibited.

Both the present preferred embodiment and the first preferred embodiment employ the thickness-shear mode. In terms of resonance characteristics, there is not much difference between the present preferred embodiment and the first preferred embodiment, despite the presence of the non-excitation region D in the acoustic wave device according to the present preferred embodiment.

Figure 17:
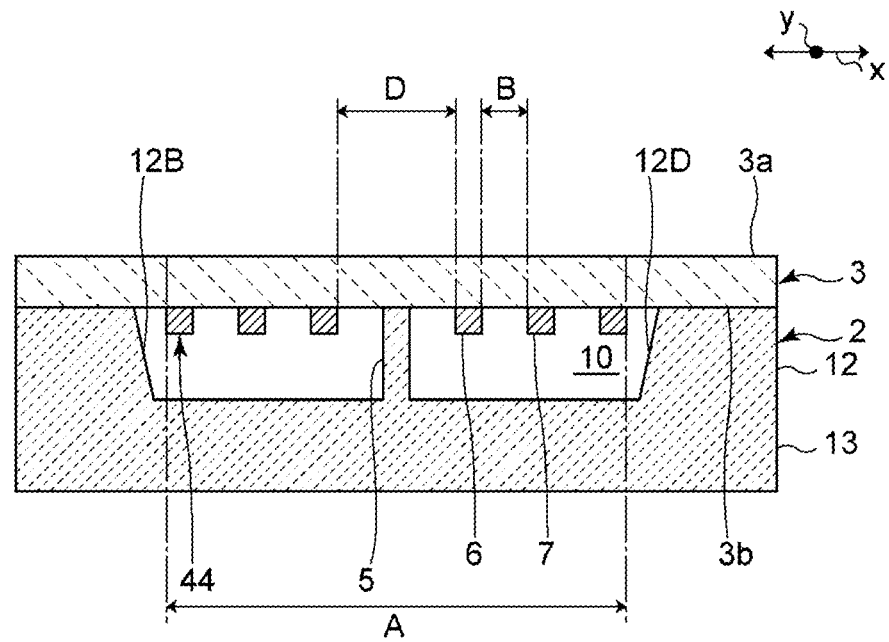
FIG. 17 is an elevational cross-sectional view of an acoustic wave device according to a fourth preferred embodiment of the present invention.

FIG. 17 is an elevational cross-sectional view of an acoustic wave device according to a fourth preferred embodiment of the present invention.

The present preferred embodiment differs from the third preferred embodiment in the following respects: the functional electrode 44 is provided on the second principal surface 3b of the piezoelectric film 3; and the functional electrode 44 is surrounded by the support portion 12 of the support substrate 2 when viewed in a plan view. The acoustic wave device in the present preferred embodiment is otherwise structurally identical to the acoustic wave device according to the third preferred embodiment.

The support 5 is between two adjacent first electrodes 6. When viewed in a plan view, the support 5 overlaps the non-excitation region D, which is a portion of the intersection region A. As in the third preferred embodiment, the acoustic wave device thereby provides against its possible structural weakness, with almost no degradation of the resonance characteristics.

Figure 18:
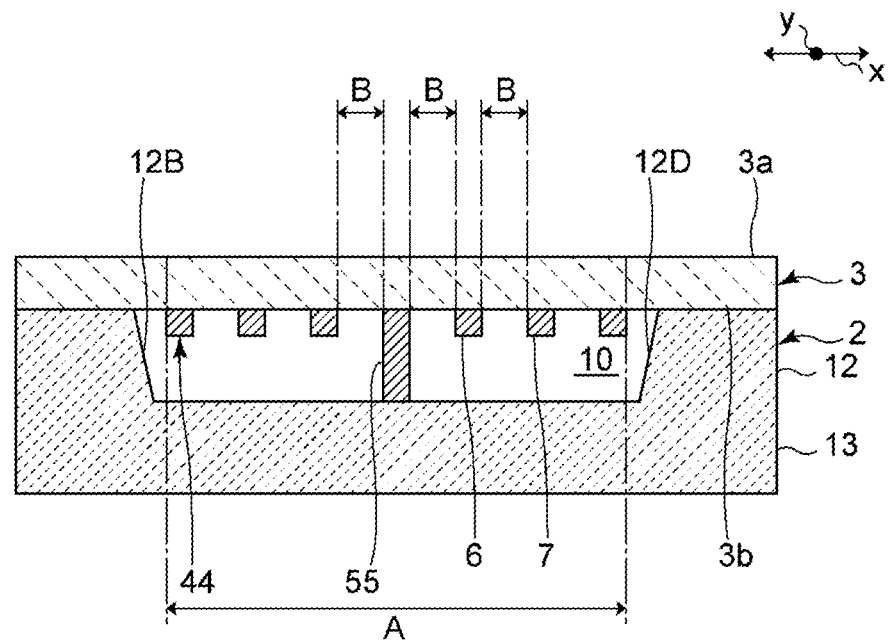
FIG. 18 is an elevational cross-sectional view of an acoustic wave device according to a fifth preferred embodiment of the present invention.
Figure 19:
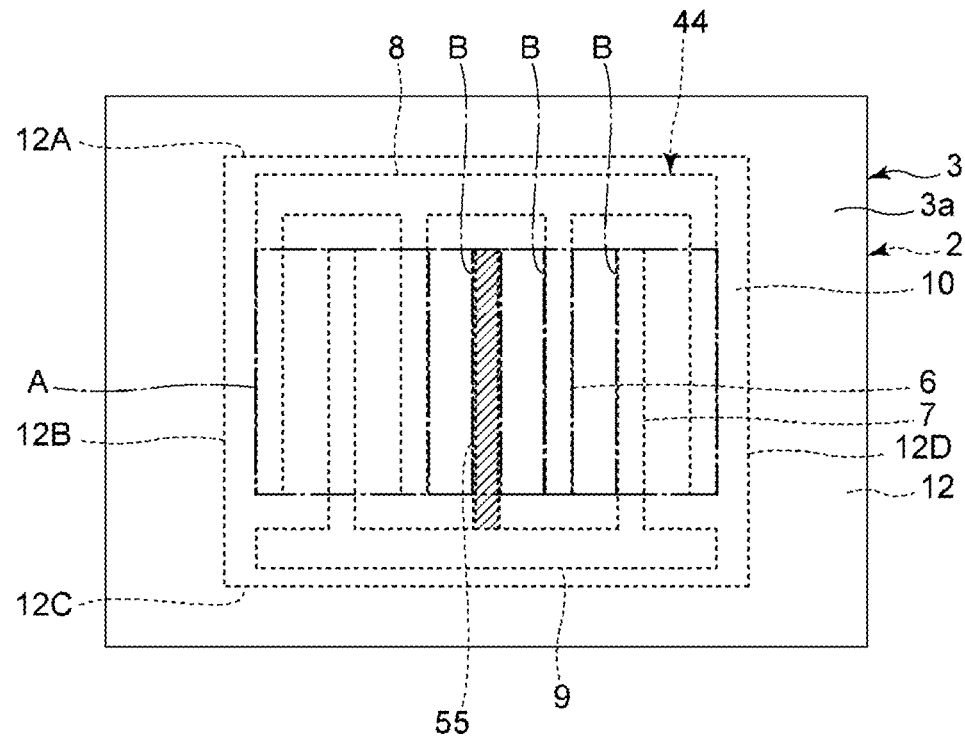
FIG. 19 is a plan view of the acoustic wave device according to the fifth preferred embodiment of the present invention.

FIG. 18 is an elevational cross-sectional view of an acoustic wave device according to a fifth preferred embodiment. FIG. 19 is a plan view of the acoustic wave device according to the fifth preferred embodiment.

Referring to FIGS. 18 and 19, the present preferred embodiment differs from the fourth preferred embodiment in the following respects: the material of a support 55 and the material of the second electrodes 7 are of the same kind; and the support 55 and the second electrodes 7 are connected to the same potential. The acoustic wave device in the present preferred embodiment is otherwise structurally identical to the acoustic wave device according to the fourth preferred embodiment.

As illustrated in FIG. 19, the support 55 is connected to the second busbar 9. The support 55 is in direct contact with the piezoelectric film 3. As with the second electrodes 7, the support 55 aids in exciting bulk waves in the thickness-shear mode. More specifically, an alternating voltage is applied between the support 55 and each of the first electrodes 6 adjacent thereto such that bulk waves in the thickness-shear mode are excited. The region between the support 55 and one of the first electrodes 6 adjacent thereto is included in the excitation region B in the present preferred embodiment. Similarly, the region between the support 55 and the other first electrode 6 adjacent thereto is included in the excitation region B in the present preferred embodiment. As mentioned above, the electrodes included in the functional electrode 44 may be made of a multilayer metal film. In this case, the support 55 may also be made of a multilayer metal film.

Bulk waves in the thickness-shear mode are hardly excited in a region that is part of the piezoelectric film 3 and is in contact with the support 55. The displacement of the piezoelectric film 3 may be less inhibited accordingly. The acoustic wave device in the present preferred embodiment thereby provides against its possible structural weakness, with almost no or little degradation of the resonance characteristics. The material of the support 55 and the material of the first electrodes 6 may be of the same kind, and the support 55 and the first electrodes 6 may be connected to the same potential. In this case, the support 55 may be connected to the first busbar 8. In the present preferred embodiment, the material of the first electrodes 6 and the material of the second electrodes 7 are preferably of the same kind.

In the manufacturing of the acoustic wave device according to the present preferred embodiment, the functional electrode 44 and the support 55 may be formed on the piezoelectric film 3, and the piezoelectric film 3 and the support substrate 2 may then be bonded together. The functional electrode 44 and the support 55 may, for example, be formed by using lift-off techniques. The following will describe a procedure of forming the support 55 and the functional electrode 44.

Figure 20A:
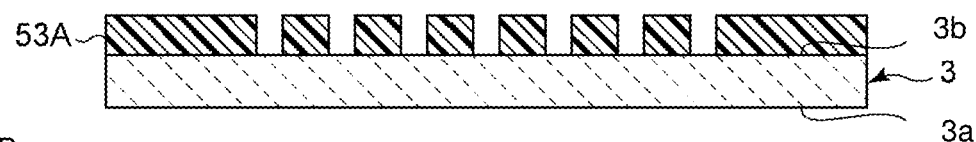
FIGS. 20A to 20C are elevational cross-sectional views explanting a procedure of forming a functional electrode and a support in the fifth preferred embodiment of the present invention.
Figure 20B:
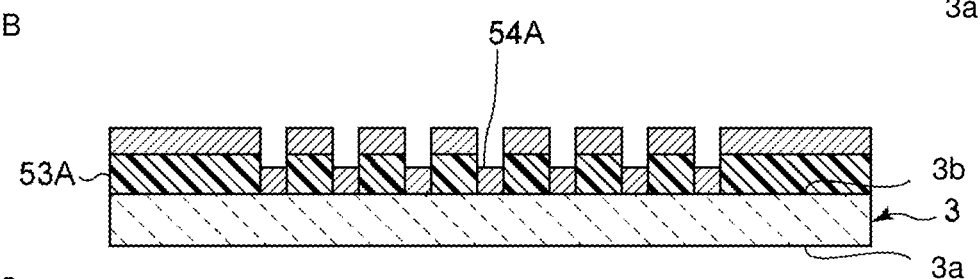
Figure 20C:
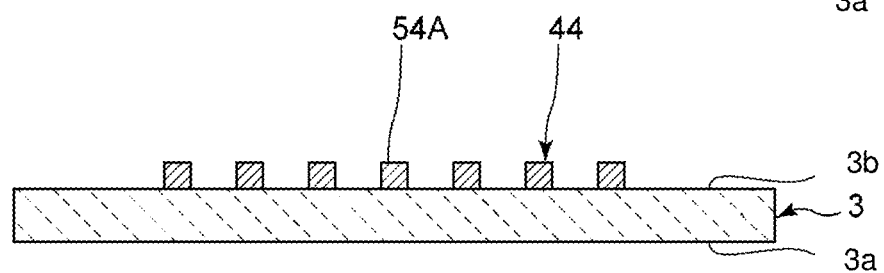
Figure 21A:
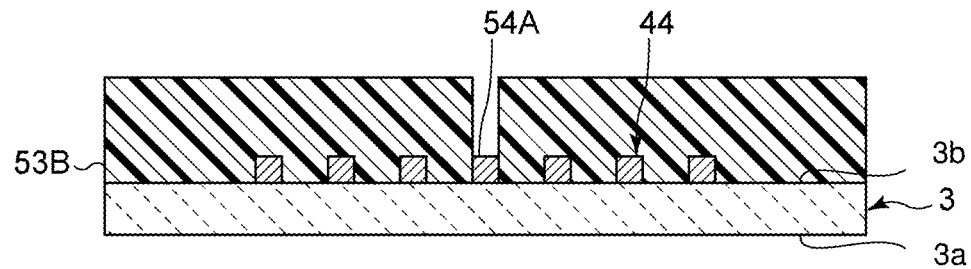
FIGS. 21A to 21C are elevational cross-sectional views explanting a procedure of forming a support in the fifth preferred embodiment of the present invention.
Figure 21B:
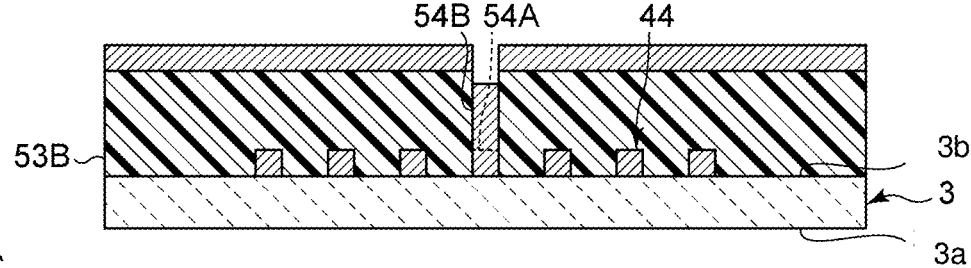
Figure 21C:
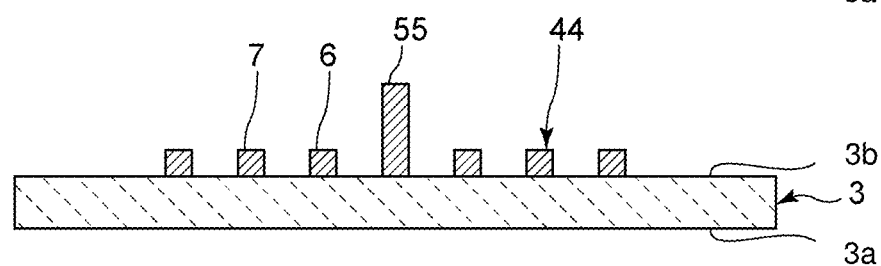

FIGS. 20A to 20C are elevational cross-sectional views for explanation of a procedure of forming a functional electrode and a support in the fifth preferred embodiment. FIGS. 21A to 21C are elevational cross-sectional views for explanation of a procedure of forming a support in the fifth preferred embodiment.

Referring to FIG. 20A, a resist pattern 53A is formed on the piezoelectric film 3. The resist pattern 53A includes cavities that conform to the shape of the functional electrode 44 and the shape of the support 55. The resist pattern 53A may be formed by using the following procedure: a resist layer is formed by, for example, a printing process; and the resist layer is patterned by light exposure followed by development.

Referring to FIG. 20B, a metal layer 54A is then formed on the piezoelectric film 3 and the resist pattern 53A. The metal layer 54A is to be formed into the functional electrode 44 and the support 55. The metal layer 54A may be a single-layer metal film or a multilayer metal film. The metal layer 54A may, for example, be formed by sputtering or vacuum deposition. The resist pattern 53A is then removed by, for example, etching to obtain the functional electrode 44, which is illustrated in FIG. 20C.

Referring to FIG. 21A, a resist pattern 53B is then formed on the piezoelectric film 3 in a manner so as to cover the functional electrode 44. The resist pattern 53B has a cavity that conforms to the shape of the support 55. The resist pattern 53B may be formed in like manner with the resist pattern 53A.

Referring to FIG. 21B, a metal layer 54B is then formed on the metal layer 54A and the resist pattern 53B. The metal layer 54B is to be formed into the support 55. A broken line in FIG. 21B schematically represents a boundary between the metal layer 54A and the metal layer 54B. The metal layers 54A and 54B may each be a single-layer metal film or a multilayer metal film. The resist pattern 53B is then removed to obtain the support 55, which is illustrated in FIG. 21C.

Figure 22:
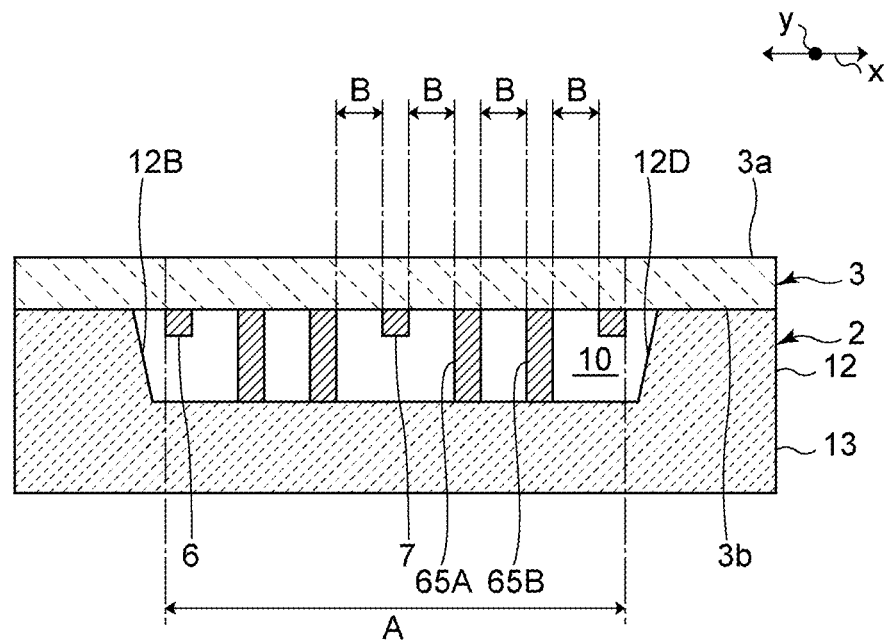
FIG. 22 is an elevational cross-sectional view of an acoustic wave device according to a modification of the fifth preferred embodiment of the present invention.

FIG. 22 is an elevational cross-sectional view of an acoustic wave device according to a modification of the fifth preferred embodiment.

The acoustic wave device in this modification includes supports 65A and the supports 65B. Two supports 65A and two supports 65B are illustrated in FIG. 22. The number of the supports 65A and the number of the supports 65B are each not limited to two.

The material of the supports 65A and the material of the first electrodes 6 are of the same kind, and the supports 65A and the first electrodes 6 are connected to the same potential. The supports 65A are connected to the first busbar 8. The material of the supports 65B and the material of the second electrodes 7 are of the same kind, and the supports 65B and the second electrodes are connected to the same potential. The supports 65B are connected to the second busbar 9. The acoustic wave device in this modification provides against its possible structural weakness.

Just as in the case where an alternating voltage is applied between each of the first electrodes 6 and the second electrode 7 adjacent thereto, an alternating voltage is applied between the second electrode 7 and each of the supports 65A adjacent thereto such that bulk waves in the thickness-shear mode are excited. In addition, an alternating voltage is applied between each of the first electrodes 6 and the support 65B adjacent thereto such that bulk waves in the thickness-shear mode are excited. Likewise, an alternating voltage is applied between each of the supports 65A and the support 65B adjacent thereto such that bulk waves in the thickness-shear mode are excited. In this way, the supports 65A and the support 65B may aid in exciting bulk waves in the thickness-shear mode.

Figure 23:
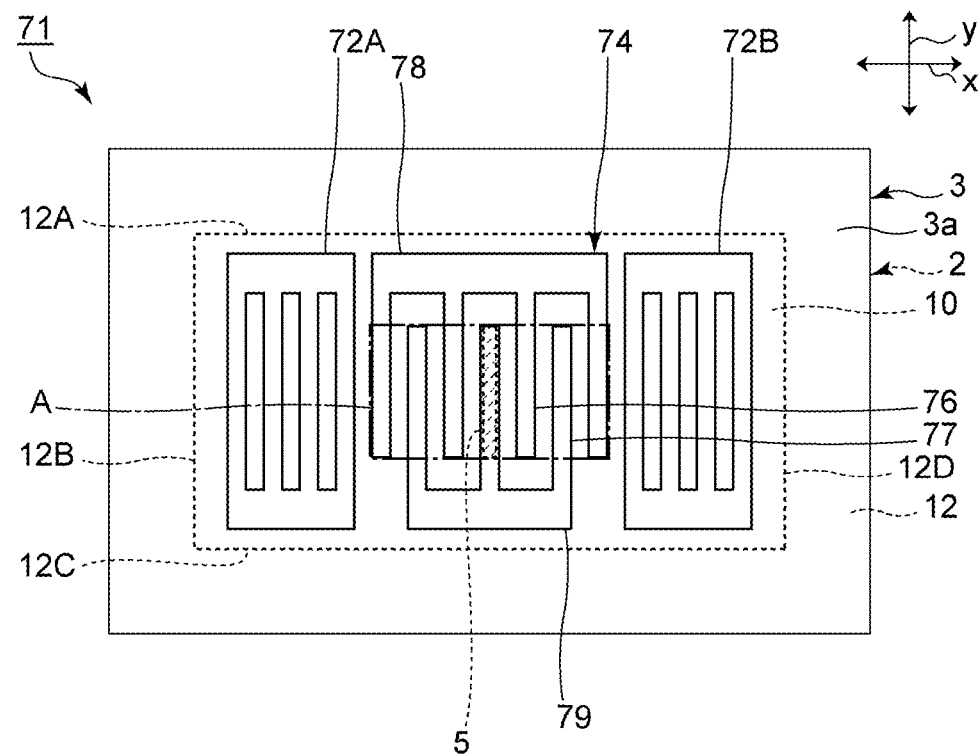
FIG. 23 is a plan view of an acoustic wave device according to a sixth preferred embodiment of the present invention.
Figure 24:
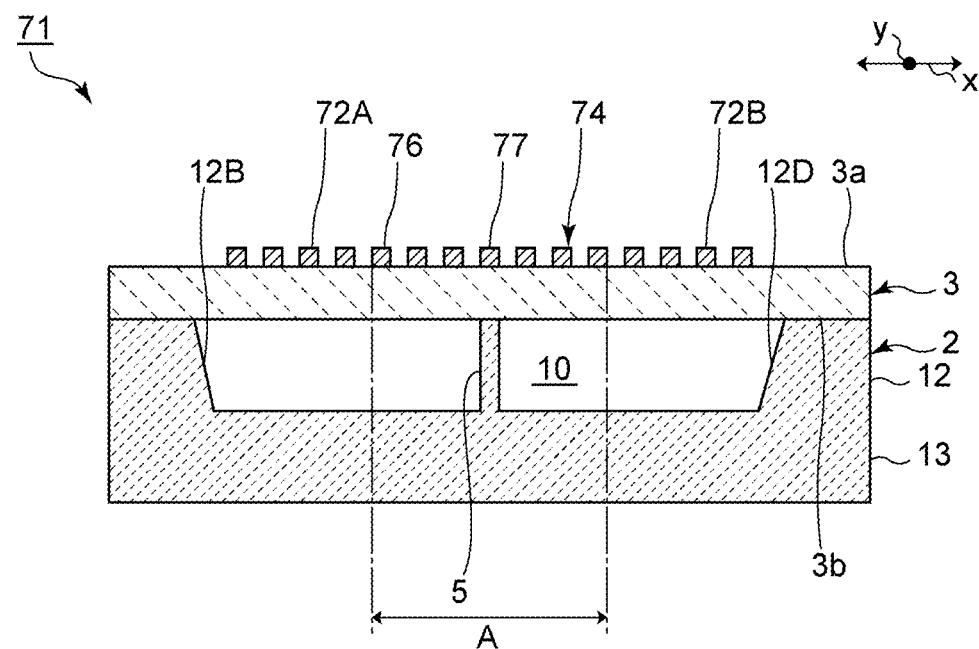
FIG. 24 is an elevational cross-sectional view of the acoustic wave device according to the sixth preferred embodiment of the present invention.

FIG. 23 is a plan view of an acoustic wave device according to a sixth preferred embodiment. FIG. 24 is an elevational cross-sectional view of the acoustic wave device according to the sixth preferred embodiment.

An acoustic wave device 71, which is illustrated in FIGS. 23 and 24, uses plate waves. The piezoelectric film 3 in the present preferred embodiment is preferably an aluminum nitride film. More specifically, the piezoelectric film 3 in the present preferred embodiment is an AlN film. Alternatively, the piezoelectric film 3 may be made of lithium tantalate or lithium niobate.

The acoustic wave device 71 includes a functional electrode or, more specifically, an IDT electrode 74. The IDT electrode 74 preferably includes a first busbar 78, a second busbar 79, first electrode fingers 76, and second electrode fingers 77. The first electrode fingers 76 are first electrodes of the present invention. The second electrode fingers 77 are second electrodes of the present invention. The first electrode fingers 76 each have an end connected to the first busbar 78. The second electrode fingers 77 each have an end connected to the second busbar 79. The first electrode fingers 76 interdigitate with the second electrode fingers 77. Each of the first electrode fingers 76 and the second electrode finger 77 adjacent thereto oppose each other in the x direction. As with the functional electrode 4 in the first preferred embodiment, the IDT electrode 74 has an intersection region A. The entirety of the intersection region A in the present preferred embodiment is an excitation region.

A pair of reflectors is provided on the piezoelectric film 3. More specifically, a reflector 72A and a reflector 72B are provided on the respective sides of the IDT electrode 74 in the x direction. When the acoustic wave device 71 is viewed in a plan view, the support portion 12 of the support substrate 2 surrounds the IDT electrode 74 and the pair of reflectors (i.e., the reflector 72A and the reflector 72B). The IDT electrode 74 and the pair of reflectors (i.e., the reflector 72A and the reflector 72B) are entirely located within the cavity 10 when viewed in a plan view.

The support 5 overlaps one of the second electrode fingers 77 when viewed in a plan view. It is only required that the support 5 overlap the intersection region A when viewed in a plan view. The acoustic wave device 71 according to the present preferred embodiment provides against its possible structural weakness.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
a support substrate including a cavity;
a piezoelectric film on the support substrate to cover the cavity;
a functional electrode on the piezoelectric film to overlap the cavity when viewed in a plan view; and
at least one support in the cavity of the support substrate to support the piezoelectric film; wherein
the functional electrode includes a plurality of electrodes arranged in a direction crossing a thickness direction of the piezoelectric film;
the plurality of electrodes include a first electrode and a second electrode that oppose each other in the direction crossing the thickness direction of the piezoelectric film and that are connected to different potentials;
when viewed in a plan view, the at least one support overlaps an intersection region in which adjacent ones of the plurality of electrodes overlap each other in a direction orthogonal or substantially orthogonal to a longitudinal direction of the first electrode;
when viewed in the plan view, the at least one support overlaps a number of the plurality of electrodes that is less than all of the plurality of electrodes, the number being an integer that is greater than or equal to 1; and
the at least one support is entirely covered by the piezoelectric film in the plan view.

2. The acoustic wave device according to claim 1, wherein a metallization ratio MR satisfies MR≤1.75(d/p)+0.075, MR being a ratio of B) to A), where:
A) is an excitation region where the first electrode and the second electrode are overlapped when viewed in the direction that the first electrode and the second electrode are opposed to each other; and
B) is a total area of the first electrode and the second electrode within the excitation region.

3. The acoustic wave device according to claim 2, wherein when viewed in a plan view, the at least one support overlaps only a region being a portion of the piezoelectric film and including the one of the electrodes thereon.

4. The acoustic wave device according to claim 1, wherein
the first electrode includes a plurality of first electrodes, and the second electrode includes a plurality of second electrodes;
the functional electrode includes a plurality of pairs of electrodes, each of the plurality of pairs including the plurality of first electrodes and the plurality of second electrodes;
in a portion of the functional electrode, two adjacent ones of the plurality of electrodes are the plurality of first electrodes;
a center-to-center distance of the two first electrodes that are adjacent to each other is about 2p with a margin of error of plus or minus about 0.5p, where p denotes a center-to-center distance of one of the plurality of first electrodes and one of the plurality of second electrodes that are adjacent to each other; and
when viewed in a plan view, the at least one support overlaps a region between the two first electrodes that are adjacent to each other.

5. The acoustic wave device according to claim 3, wherein
the piezoelectric film includes a first principal surface and a second principal surface on opposite sides;
the second principal surface is closer than the first principal surface to the support substrate; and
the functional electrode is on the second principal surface of the piezoelectric film;
a material of the at least one support and a material of the second electrode are of the same kind; and
the at least one support and the second electrode are connected to the same potential.

6. The acoustic wave device according to claim 2, wherein
the at least one support includes a plurality of supports;
when viewed in a plan view, the plurality of supports overlap the plurality of electrodes; and
when viewed in a plan view, each of the plurality of supports overlaps only a corresponding one of the plurality of electrodes.

7. The acoustic wave device according to claim 1, wherein
the piezoelectric film is made of lithium niobate or lithium tantalate; and
d/p is less than or equal to about 0.5, where d denotes a thickness of the piezoelectric film, and p denotes a center-to-center distance of the first electrode and the second electrode that are adjacent to each other.

8. The acoustic wave device according to claim 7, wherein d/p is about 0.24 or less.

9. The acoustic wave device according to claim 1, wherein
the piezoelectric film is made of lithium niobate, lithium tantalate, or aluminum nitride;
the first electrode includes a plurality of first electrodes, and the second electrode includes a plurality of second electrodes; and
the functional electrode is an interdigital transducer (IDT) electrode including a plurality of pairs of electrodes, each of the plurality of pairs including a respective one of the plurality of first electrodes and a respective one of the plurality of second electrodes.

10. The acoustic wave device according to claim 9, wherein the at least one support is made of metal.

11. The acoustic wave device according to claim 1, wherein
the piezoelectric film is made of lithium niobate or lithium tantalate; and
the acoustic wave device uses a bulk wave in a thickness-shear mode.

12. The acoustic wave device according to claim 1, wherein
the piezoelectric film is made of lithium niobate or lithium tantalate; and
Euler angles ($\varphi$, $\theta$, $\psi$) of the lithium niobate or the lithium tantalate fall within the range of any of the following formula 1), 2) and 3):

$$(0°+10°, 0°\sim 20°, \psi) \quad \text{formula 1);}$$

$$(0°\pm 10°, 20°\sim 80°, 0°\sim 60°(1-(\theta-50)^2/900)^{1/2})) \text{ or } (0°\pm 10°, 20°\sim 80°, [180°-60°(1-(\theta-50)^2/900)^{1/2}])-180°) \quad \text{formula 2); and}$$

$$(0°\pm 10°, [180°-30°(1-(\psi-90)^2/8100)^{1/2}]\sim 180°, \psi) \quad \text{formula 3).}$$

13. The acoustic wave device according to claim 1, wherein
the piezoelectric film is made of lithium niobate or lithium tantalate; and
Euler angles ($\varphi$, $\theta$, $\psi$) of the lithium niobate or the lithium tantalate are positioned within the intersection region.

14. The acoustic wave device according to claim 1, wherein when viewed in a plan view, the at least one support overlaps only one of the plurality of electrodes.

15. The acoustic wave device according to claim 1, wherein the at least one support has a thermal conductivity higher than a thermal conductivity of the piezoelectric film.

16. The acoustic wave device according to claim 4, wherein when viewed in a plan view, the at least one support overlaps a midsection of the region between the two first electrodes that are adjacent to each other.

17. The acoustic wave device according to claim 1, wherein
the piezoelectric film includes a first principal surface and a second principal surface on opposite sides;
the second principal surface is closer than the first principal surface to the support substrate; and
the functional electrode is on the first principal surface of the piezoelectric film.

* * * * *